(12) United States Patent
Kang et al.

(10) Patent No.: US 10,818,826 B2
(45) Date of Patent: Oct. 27, 2020

(54) LIGHT EMITTING DIODE APPARATUS AND MANUFACTURING METHOD THEREOF

(71) Applicant: SAMSUNG ELECTRONICS CO., LTD., Suwon-si (KR)

(72) Inventors: Jin-hee Kang, Yongin-si (KR); Ji-Hoon Kang, Seoul (KR); Seong-woo Cho, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/904,876

(22) Filed: Feb. 26, 2018

(65) Prior Publication Data
US 2019/0115506 A1    Apr. 18, 2019

(30) Foreign Application Priority Data

Oct. 17, 2017 (KR) ........................ 10-2017-0134562

(51) Int. Cl.
*H01L 33/50* (2010.01)
*H01L 33/60* (2010.01)
*H01L 33/62* (2010.01)
*H01L 33/20* (2010.01)
*H01L 25/075* (2006.01)
(Continued)

(52) U.S. Cl.
CPC ........ *H01L 33/502* (2013.01); *H01L 25/0756* (2013.01); *H01L 33/0093* (2020.05); *H01L 33/20* (2013.01); *H01L 33/46* (2013.01); *H01L 33/60* (2013.01); *H01L 33/62* (2013.01); *H01L 2933/0041* (2013.01); *H01L 2933/0058* (2013.01); *H01L 2933/0066* (2013.01)

(58) Field of Classification Search
CPC ....... H01L 33/502; H01L 33/10; H01L 33/60; H01L 33/0079
See application file for complete search history.

(56) References Cited

U.S. PATENT DOCUMENTS

| 9,018,619 | B2 | 4/2015 | Saxler |
| 9,354,366 | B2 | 5/2016 | Jain |
| 2010/0033947 | A1 | 2/2010 | Lin et al. |

(Continued)

FOREIGN PATENT DOCUMENTS

| JP | 2010-263252 A | 11/2010 |
| KR | 10-2013-0022085 A | 3/2012 |

(Continued)

OTHER PUBLICATIONS

Written Opinion (PCT/ISA/237) dated Jul. 16, 2018 issued by the International Searching Authority in International Application No. PCT/KR2018/003853.

(Continued)

*Primary Examiner* — Phat X Cao
(74) *Attorney, Agent, or Firm* — Sughrue Mion, PLLC

(57) ABSTRACT

A manufacturing method of a light emitting diode apparatus is provided. This method includes forming a light emitting diode on the substrate, forming a light leakage preventing layer to surround the side surface of the light emitting diode, etching a region corresponding to the light emitting diode in the substrate, and bonding a wavelength converting material to a lower portion of the light emitting diode in the etched region, in which the wavelength converting material includes a semiconductor layer including a quantum well layer.

10 Claims, 16 Drawing Sheets

(51) Int. Cl.
*H01L 33/46* (2010.01)
*H01L 33/00* (2010.01)

(56) References Cited

U.S. PATENT DOCUMENTS

| | | |
|---|---|---|
| 2010/0244065 A1 | 9/2010 | Butterworth |
| 2011/0150020 A1 | 6/2011 | Haase et al. |
| 2012/0086028 A1* | 4/2012 | Beeson ................ H01L 33/501 257/98 |
| 2013/0048940 A1 | 2/2013 | Sills et al. |
| 2017/0005242 A1 | 1/2017 | Kim et al. |
| 2017/0012183 A1* | 1/2017 | Schricker .............. H01L 33/505 |
| 2017/0054054 A1 | 2/2017 | Bauer et al. |
| 2017/0077363 A1 | 3/2017 | Oh et al. |
| 2017/0279022 A1 | 9/2017 | Jung et al. |
| 2017/0294479 A1* | 10/2017 | Cha .................... H01L 25/0655 |

FOREIGN PATENT DOCUMENTS

| | | |
|---|---|---|
| KR | 10-1520743 B1 | 5/2015 |
| WO | 2009/048704 A2 | 4/2009 |
| WO | 2015/011590 A1 | 1/2015 |

OTHER PUBLICATIONS

International Search Report (PCT/ISA/210) dated Jul. 16, 2018 issued by the International Searching Authority in International Application No. PCT/KR2018/003853.
Search Report dated May 10, 2019 by the European Patent Office in counterpart European Patent Application No. 18157661.2.
Communication dated Apr. 16, 2020 from the European Patent Office in application No. 18157661.2.

* cited by examiner

LIGHT EMITTING DIODE APPARATUS AND MANUFACTURING METHOD THEREOF

CROSS-REFERENCE TO RELATED APPLICATIONS

This application is based on and claims priority under 35 U.S.C. § 119 to Korean Patent Application No. 10-2017-0134562, filed on Oct. 17, 2017, in the Korean Intellectual Property Office, the disclosure of which is incorporated by reference herein in its entirety.

BACKGROUND

1. Field

Apparatuses and methods consistent with what is disclosed herein broadly relate to an LED apparatus and a manufacturing method thereof, and more particularly, to an LED apparatus that can be manufactured in an extremely small size and manufacturing method thereof.

2. Description of Related Art

2-Dimensional LED elements, in related art, use III-V group semiconductor materials (Ga, In, Al) to control the optical energy bandgap through the material type, thickness, and doping process of the active layer, thereby inducing a single color such as red, green, and blue. The semiconductor layer included in the active layer may be deposited by Metal-Organic Chemical Vapor Deposition (MOCVD) equipment, and may include a quantum well layer within the active layer in order to realize individual unique monochromatic light-emitting elements. The quantum well layer formed within the active layer is surrounded by a p-type semiconductor layer and an n-type semiconductor layer formed thereabove and thereunder, and receives electrons and holes and recombines them within the activation layer to emit light of unique monochromatic color. Then, each of the monochromatic LED elements constitute an LED element package that combines red, green, and blue through packaging or transfer process, and the three-color LED package element can represent various colors as one.

However, as the size of the LEDs becomes smaller, the individual monochromatic 2D LEDs (including the nanowire LEDs) have too limited element combination efficiency and LED element array configuration to realize various colors. In particular, while the micro-sized blue LED elements have a maximum luminous efficiency of 30%, the luminous efficiency is limited for red LED elements that have 5%, and for green LED elements that have 15%. Accordingly, while it is demanded to realize a display device using with micro-sized LED elements for high resolution, due to the decreased luminous efficiency and limitations of the LED element arrangement as mentioned above, the current display device does not satisfy the required brightness and energy efficiency. In addition, there is a drawback associated with driving of individual LED elements. That is, the configuration of the display device becomes complicated since different driving voltages are required for driving respective red, green, and blue LED elements.

Meanwhile, an additional III-V group semiconductor material layer (Multi-QW) may be formed within the LED element active layer region to control the wavelength of light. However, it is difficult to independently control each of the layers due to optical and quantum interference phenomena between the light emitting layer and the additional color conversion semiconductor layer. For example, it is difficult to control the light emitting characteristics of the LED element, the intensity of light, the resonance wavelength range, and the full width at half maximum (FWHM). Particularly, while the red and green LED elements require a plurality of additional insulating layers to form a resonance structure, this will deteriorate the suitability of the process and the utilization of the process structure. This may limit the wavelength conversion efficiency of the LED element for each color. In addition, in the case of a nano-wire type LED element, considering the size of the nano-wire, it is difficult to form a resonance structure within the active layer due to processability and uneven thickness associated with the wire shapes.

Meanwhile, a color conversion LED element using an organic phosphor (phosphor or quantum dot) realizes red, green and white colors by applying phosphors on a single color LED element. In this case, the phosphors are applied to the upper portion of the LED element with a method such as printing or dispensing, but such applying process results in many changes in the characteristics due to unevenness of the phosphor layer. Particularly, at present, in view of the limitations associated with the characteristics of the organic phosphor material, the phosphor layer has a considerably large thickness in order to induce only a desired wavelength of light and cut off unnecessary wavelength light. The thick phosphor layer can increase the absorption rate of light having an unnecessary wavelength, but has a problem of deteriorated brightness, luminous efficiency and color purity of light having phosphors compared to the luminous efficiency of the LED element. In addition, the error in the thickness of the uneven phosphor layer generated during the application process influences the change in the color gamut. Meanwhile, the phosphor layer made of an organic material is vulnerable to thermal deformation. In the structure in which the phosphor is directly applied on the surface of the LED element, the optical and chemical characteristics of the phosphors are deteriorated due to heat generated in the LED element, which causes a significant problem in the reliability of the characteristics of the LED element. In addition, the related method using phosphors suffers a problem such as an inevitable increase in the manufacturing cost as well as the complexity of the manufacturing process of the LED element due to the cost of the phosphor material and the application process.

Accordingly, there is a need to develop LED elements that solve the above problems.

The above information is presented as background information only to assist with understanding of the present disclosure. No determination has been made, and no assertion is made, as to whether any of the above might be applicable as prior art with regard to the present disclosure.

SUMMARY

Exemplary embodiments may overcome the above disadvantages and other disadvantages not described above. Also, the present disclosure is not required to overcome the disadvantages described above, and an exemplary embodiment may not overcome any of the problems described above.

In order to solve one or more problems described above, one or more of exemplary embodiments are directed to providing an LED apparatus which can be manufactured in an extremely small size and can emit light of uniform quality, and manufacturing method thereof.

In order to achieve at least one of the aspects mentioned above, a manufacturing method of an LED apparatus is provided, which includes forming a light emitting diode on the substrate, forming a light leakage preventing layer to surround the side surface of the light emitting diode, etching a region corresponding to the light emitting diode in the substrate, and bonding a wavelength converting material to a lower portion of the light emitting diode in the etched region, in which the wavelength converting material includes a semiconductor layer including a quantum well layer.

Further, the method may additionally include generating a wavelength converting material, which may include forming an upper distributed Bragg reflector (DBR) coating layer on another substrate ('second substrate') through one of metal-organic chemical vapor deposition (OCVD), molecular beam epitaxy (MBE) and chemical vapor deposition (CVD) processes, forming a wavelength conversion layer on the upper DBR coating layer through CVD process, forming a lower DBR coating layer on the wavelength conversion layer through the MOCVD or the MBE process, and etching a region of the second substrate other than the region corresponding to the light emitting diode, in which bonding may include bonding the wavelength converting material to a lower portion of the light emitting diode so that the lower DBR coating layer is bonded to the lower surface of the light emitting diode.

Further, the upper DBR coating layer, the wavelength conversion layer, and the lower DBR coating layer may be formed to have a size corresponding to the area of the light emitting diode.

Further, after bonding the wavelength converting material to a lower portion of the light emitting diode, the method may additionally include removing the second substrate included in the wavelength converting material.

Further, the generating the wavelength converting material may further include forming a reflective layer that surrounds a side surface of the wavelength converting material and is extended by a predetermined length from the side surface of the wavelength converting material to the lower portion of the lower DBR coating layer.

Further, the light leakage preventing layer may prevent light emitted from the light emitting diode from being emitted through the side surface of the light emitting diode, the wavelength conversion layer may convert a first wavelength of light entering from the light emitting diode to a predetermined second wavelength and diffuse and emit the light of the second wavelength to the outside through a diffusion material, the lower DBR coating layer may pass the light of the first wavelength emitted from the light emitting diode and reflect the light of the second wavelength that is wavelength-converted by the wavelength conversion layer, the upper DBR coating layer may pass the light of the second wavelength and reflect the light of a wavelength other than the second wavelength, and the reflective layer may reflect the wavelength-converted light emitted through the side surface and the lower portion of the wavelength converting material.

Further, the bonding may include forming an optical adhesive layer on one of the lower surface of the light emitting diode and the lower surface of the lower DBR coating layer to bond the wavelength converting material to a lower portion of the light emitting diode.

Further, the wavelength conversion layer may be one of a wavelength conversion layer corresponding to red (R) color, a wavelength conversion layer corresponding to green (G) color, a wavelength conversion layer corresponding to blue (B) color, and a wavelength conversion layer corresponding to white (W) color.

Further, the method may additionally include forming a plurality of pads under the light emitting diode to receive external power.

Further, the wavelength conversion layer may be a II-VI group semiconductor material, which is an inorganic semiconductor material that includes an III-V group material.

Meanwhile, according to an embodiment, a light emitting diode (LED) apparatus is provided, which includes a light emitting diode, a light leakage preventing layer formed so as to surround a side surface of the light emitting diode, to prevent a light emitted from the light emitting diode from being emitted through the side surface of the light emitting diode, a wavelength conversion layer formed on the light emitting diode to convert a wavelength of light entering from the light emitting diode and emit resultant light, and a reflective layer formed so as to surround a side surface of the wavelength conversion layer to reflect the light that is wavelength-converted, in which the wavelength conversion layer may be a semiconductor layer that includes a quantum well layer.

Further, the LED apparatus may additionally include a lower distributed Bragg reflector (DBR) coating layer formed between the light emitting diode and the wavelength conversion layer, in which the lower DBR coating layer passes a light of a first wavelength emitted from the light emitting diode and reflects a light of a second wavelength that is wavelength-converted by the wavelength conversion layer.

Further, the LED apparatus may additionally include an upper DBR coating layer formed on the wavelength conversion layer, in which the upper DBR coating layer passes the light of the second wavelength, and reflects the light of a wavelength other than the second wavelength.

Further, the upper DBR coating layer, the wavelength conversion layer, and the lower DBR coating layer may be sequentially deposited on another substrate through chemical vapor deposition (CVD) process, and separated from the another substrate and attached to an upper portion of the light emitting diode.

Further, the LED apparatus may additionally include an optical adhesive layer formed between the light emitting diode and the lower DBR coating layer.

Further, the reflective layer may be extended by a predetermined length from a side surface of the wavelength conversion layer to between the wavelength conversion layer and the light emitting diode to reflect the wavelength-converted light that is emitted through a lower portion of the wavelength conversion layer.

Further, the wavelength conversion layer may convert a first wavelength of the light entering from the light emitting diode into a predetermined second wavelength, and diffuse and emit the light of the second wavelength to outside through a diffusion material.

Further, the wavelength conversion layer may be one of a wavelength conversion layer corresponding to red (R) color, a wavelength conversion layer corresponding to green (G) color, a wavelength conversion layer corresponding to blue (B) color, and a wavelength conversion layer corresponding to white (W) color.

Further, the LED apparatus may additionally include a plurality of pads formed under the light emitting diode to receive external power.

Further, the wavelength conversion layer may be a II-VI group semiconductor material, which is an inorganic semiconductor material that includes an III-V group material.

According to various exemplary embodiments as described above, a semiconductor manufacturing process may be used so that the size of the LED apparatus can further be reduced, while a uniform optical performance is ensured.

BRIEF DESCRIPTION OF THE DRAWINGS

The above and other aspects, features, and advantages of certain embodiments of the present disclosure will become more apparent from the following description taken in conjunction with the accompanying drawings, in which.

DETAILED DESCRIPTION OF EXEMPLARY EMBODIMENTS

Figure 1:
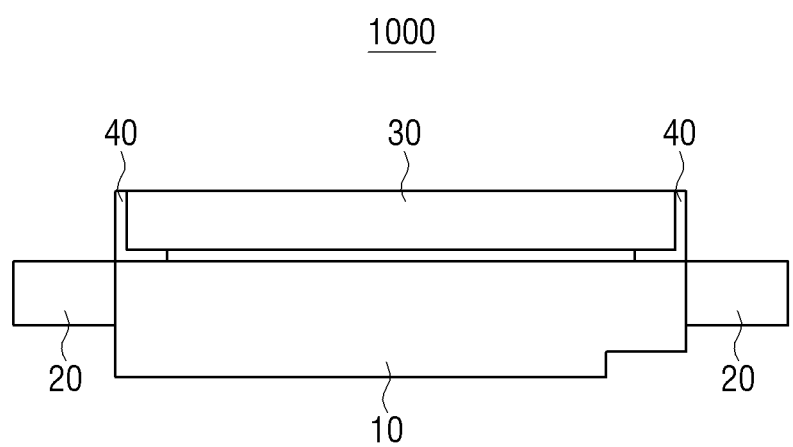
FIG. 1 is a block diagram illustrating a light emitting diode (LED) apparatus according to an embodiment.

Exemplary embodiments of the present disclosure may be diversely modified. Accordingly, specific exemplary embodiments are illustrated in the drawings and are described in detail in the detailed description. However, it is to be understood that the present disclosure is not limited to a specific exemplary embodiment, but includes all modifications, equivalents, and substitutions without departing from the scope and spirit of the present disclosure. Also, well-known functions or constructions are not described in detail since they would obscure the disclosure with unnecessary detail.

Hereinafter, various exemplary embodiments of the present disclosure will be described in detail with reference to the accompanying drawings.

FIG. 1 is a block diagram illustrating a light emitting diode (LED) apparatus 1000 according to an exemplary embodiment. Referring to FIG. 1, an LED apparatus 1000 includes a light emitting diode 10, a light leakage preventing layer 20, a wavelength conversion layer 30, and a reflective layer 40.

The light emitting diode 10 refers to a p-n junction diode that emits light from recombination of excess electron and hole pairs. When the forward voltage is applied to the light emitting diode 10, electrons in the n-type semiconductor layer meet with the holes of the p-type semiconductor layer and such recombining causes light emission.

The light emitting diode 10 emits light when a voltage is applied, and the emitted light may fall incident on the wavelength conversion layer 30 to be described in greater detail below. Hereinafter, it is assumed that the light emitting diode 10 emits blue light. However, exemplary embodiments are not limited thereto, and light of different colors may be emitted. The type of the wavelength conversion layer 30 may vary depending on the color of the light emitted by the light emitting diode 10. Alternatively, the type of the wavelength conversion layer 30 may vary depending on the color of the light to be finally emitted.

The light leakage preventing layer 20 may be formed to surround the side surface of the light emitting diode 10 to prevent light emitted from the light emitting diode 10 from being emitted through the side surface of the light emitting diode 10.

The upper surface of the light leakage preventing layer 20 may be at the same height as the upper surface of the light emitting diode 10. However, exemplary embodiments are not limited thereto, and the upper surface of the light leakage preventing layer 20 may be higher than the upper surface of the light emitting diode 10. In this case, the light leakage preventing layer 20 may partially cover the side surface (or the reflective layer 40) of the wavelength conversion layer 30. In addition, the lower surface of the light leakage preventing layer 20 may be lower than the lower surface of the light emitting diode 10.

Meanwhile, in FIG. 1, the light leakage preventing layer 20 is shown only on the left and right sides of the light emitting diode 10. However, this is only because FIG. 1 is a cross-sectional view of the LED apparatus 1000, and accordingly, the light leakage preventing layer 20 may be formed so as to surround the side surface of the light emitting diode 10. This is also the same for the reflective layer 40 to be described in further detail below.

The wavelength conversion layer 30 is formed on the light emitting diode 10 and may convert the wavelength of the light entering from the light emitting diode 10 and emit the resultant light. In an example, the wavelength conversion layer 30 may be a semiconductor layer that contains a quantum well layer.

The related active layer has a quantum well layer formed therewithin, with the upper and lower portions being surrounded by a p-type semiconductor layer and an n-type semiconductor layer, respectively, so that electrons and holes are received and recombined in the activation layer to emit unique monochromatic light.

Specifically, in an exemplary embodiment, the quantum well layer emits energy when specific impurity electrons within the quantum well layer, which are excited by free electrons accelerated by the electric field, return to their original state. The light emitting diode 10 may also be manufactured in the same structure and emit light through the same operation. That is, the related quantum well layer may be a layer that emits light as current flows, which is also called 'electroluminescence'.

In the case of electroluminescence, it is possible to control the optical bandgap through the material type, the thickness and the doping process of the active layer using III-VI group semiconductor materials such as Ga, In and Al, thereby manufacturing an active layer having a structure that induces the single color such as blue, red and green. In addition, it is possible to form a layer for electroluminescence through a semiconductor process.

To this end, the wavelength conversion layer 30 includes a quantum well layer, it may act in a completely different way. The quantum well layer included in the wavelength conversion layer 30 acts not as electroluminescence but as photoluminescence.

The 'photoluminescence' refers to absorbing light energy and emitting light of different wavelengths. In other words, the photoluminescence means absorbing photons to emit a wavelength-converted light. In related art, materials such as phosphors or quantum dots have been used as a material for photoluminescence. However, the above materials cannot be formed by a semiconductor process, but are formed by printing or dispensing. In this case, there is a high possibility that the photoluminescence layer is unevenly formed, and as the emitted wavelength is determined according to thickness thereof, the emitted light may also be degraded in quality.

Meanwhile, the wavelength conversion layer 30 includes a quantum well layer and may be formed of a semiconductor material. In particular, the wavelength conversion layer 30 may be a II-VI group semiconductor material, and may include a quantum well layer to which Zn, Se, Mg, and Cd are applied, for example. When the wavelength conversion layer 30 is realized with the II-VI group semiconductor material, the photoluminescence effect can be improved.

In addition, the wavelength conversion layer 30 may be formed through a semiconductor process such as deposition and patterning, such that a layer having a thinner and uniform thickness can be formed, unlike the case of using phosphors or quantum dots.

Meanwhile, the wavelength conversion layer 30 acts as a photoluminescence unlike the quantum well layer within the light emitting diode 10. That is, the wavelength conversion layer 30 may absorb the photons emitted from the light emitting diode 10 and emit energy as the specific impurity electrons in the quantum well layer are excited by the photons and return to their original state. In an example, the emitted energy is light, and the wavelength of the emitted light may be determined according to the material, thickness, etc. of the wavelength conversion layer 30.

That is, while the wavelength conversion layer 30 emits light similarly to electroluminescence, it is also similar to the operation of photoluminescence in a sense that it is operated by incident light. In addition, the wavelength conversion layer 30 may be formed through a semiconductor process such as an MOCVD or MBE deposition process, so that the wavelength conversion layer 30 may be formed with an uniform thickness, which can in turn enhance the quality of emitted light.

As described above, the wavelength conversion layer 30 may convert the first wavelength of light entering from the light emitting diode 10 into a predetermined second wavelength, and diffuse and emit the light of the second wavelength through the diffusion material to the outside.

The wavelength conversion layer 30 may be one of a wavelength conversion layer corresponding to red (R) color, a wavelength conversion layer corresponding to green (G) color, a wavelength conversion layer corresponding to blue (B) color, and a wavelength conversion layer corresponding to white (W) color. However, exemplary embodiments are not limited thereto, and the wavelength conversion layer 30 may be a wavelength conversion layer that emits different colors as needed.

The reflective layer 40 may be formed so as to surround the side surface of the wavelength conversion layer 30 to reflect the wavelength-converted light. That is, the reflective layer 40 allows the light emitted from the wavelength conversion layer 30 to be emitted only from one surface of the wavelength conversion layer 30, thereby increasing the brightness of the light.

Meanwhile, the reflective layer 40 may be extended between the wavelength conversion layer 30 and the light emitting diode 10 from a side surface of the wavelength conversion layer 30 by a predetermined length to reflect the wavelength-converted light emitted through the lower portion of the wavelength conversion layer 30.

Figure 2:
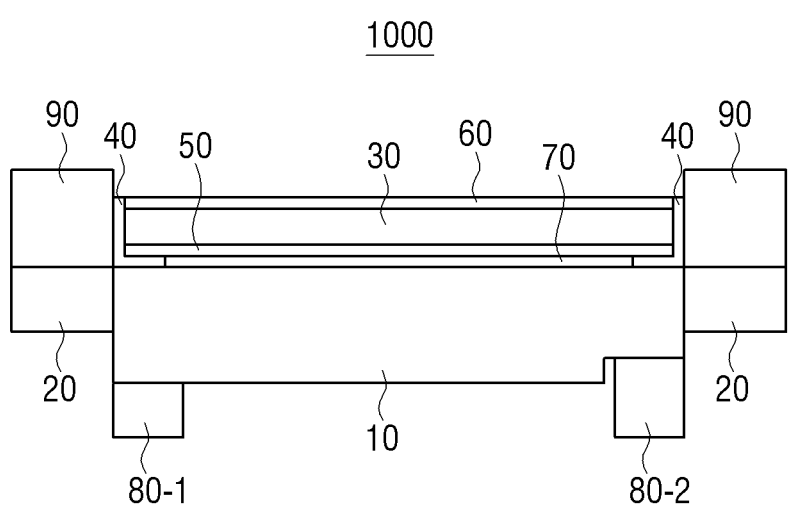
FIG. 2 is a block diagram illustrating a detailed configuration of the LED apparatus according to an embodiment.

FIG. 2 is a block diagram illustrating a detailed configuration of the LED apparatus 1000 according to an exemplary embodiment. The detailed description of the configuration shown in FIG. 2 that overlap the configuration shown in FIG. 1 will be omitted for the sake of brevity.

In addition to the configuration shown in FIG. 1, the LED apparatus 1000 may further include a lower distributed Bragg reflector (DBR) coating layer 50, an upper DBR coating layer 60, an optical adhesive layer 70, a plurality of pads 80-1, 80-2, and a substrate 90.

The lower DBR coating layer 50 may be formed between the light emitting diode 10 and the wavelength conversion layer 30. For example, according to one embodiment, "in between" may be defined as in direct contact with these layers via an adhesive and in another embodiment, "in between" may include other layers there between such as an adhesive layer and perhaps some other layer. In other words, adhesive may or may not be viewed as a separate layer, depending on the terminology. The lower DBR coating layer 50 may pass the light of the first wavelength emitted from the light emitting diode 10, and reflect the light of the second wavelength wavelength-converted by the wavelength conversion layer 30.

The upper DBR coating layer 60 may be formed on the wavelength conversion layer 30. For example, according to one embodiment, "formed on" may be defined as in direct contact with the wavelength conversion layer 30 and in another embodiment, "formed on" may include other layers therein between such as an adhesive layer. The upper DBR coating layer 60 may pass light of the second wavelength wavelength-converted by the wavelength conversion layer 30, and reflect light of wavelengths other than the second wavelength.

The LED apparatus 1000 may emit high-purity light by the lower DBR coating layer 50 and the upper DBR coating layer 60.

Meanwhile, the lower DBR coating layer 50 and the upper DBR coating layer 60 may be formed through a semiconductor process such as CVD in the same manner as the wavelength conversion layer 30. For example, the upper DBR coating layer 60, the wavelength conversion layer 30, and the lower DBR coating layer 50 may be sequentially deposited on the substrate through CVD process, and separated from the substrate and attached to the upper portion of the light emitting diode 10. That is, the upper DBR coating layer 60, the wavelength conversion layer 30, and the lower DBR coating layer 50 may be formed on a substrate separate from the light emitting diode 10 through a semiconductor process. Hereinbelow, the upper DBR coating layer 60, the wavelength conversion layer 30, and the lower DBR coating layer 50, and the like are collectively referred to as wavelength converting materials.

In an example, an optical adhesive layer 70 may be used to bond the light emitting diode 10 and the wavelength converting material. That is, the optical adhesive layer 70 between the light emitting diode 10 and the lower DBR coating layer 50 may bond the light emitting diode 10 and the lower DBR coating layer 50. In an example, the optical adhesive layer 70 may be a transparent material capable of transmitting light.

A method for manufacturing a wavelength converting material using a separate substrate, according to an exemplary embodiment, will be described in further detail below.

A plurality of pads 80-1, 80-2 may be formed under the light emitting diode 10 to receive external power. The plurality of pads 80-1, 80-2 may receive external power and apply voltage to the light emitting diode 10.

Each of the plurality of pads 80-1, 80-2 may be connected to each of the p-type semiconductor layer and the n-type semiconductor layer of the light emitting diode 10 to apply voltage thereto.

The substrate 90 may be the remaining structure that is not removed in the manufacturing process, and may be in such a form that it surrounds the side surface of the wavelength converting material. The substrate 90 may be particularly useful for a structure that includes a plurality of connected LED apparatuses 1000.

Meanwhile, in FIG. 2, the substrate 90 is shown only on the left and right sides of the wavelength converting materials. However, this is only because FIG. 2 is a cross-sectional view of the LED apparatus 1000, and accordingly, the substrate 90 may be formed so as to surround the side surface of the wavelength converting materials. An embodiment or a variation of an embodiment in which the substrate 90 that surrounds the wavelength converting material is also in direct contact with one or more surfaces of the wavelength converting materials Meanwhile, for such LED apparatus 1000 having the structure described above, the wavelength conversion layers 30 can be uniformly manufactured, and accordingly, the quality of the light emitted from the LED apparatus 1000 can be enhanced.

Hereinafter, a method of manufacturing the LED apparatus 1000, according to an exemplary embodiment, will be described.

Hereinafter, terms such as "deposition", "growth", "stack", and so on can be understood as referring to forming a semiconductor material layer, and the layer or thin film formed through various exemplary embodiments may be formed in a growth chamber using metal-organic vapor deposition (MOCVD) method or molecular beam epitaxy (MBE) method, and may be deposited by various methods such as PECVD, APCVD, LPCVD, UHCVD, PVD, electron beam method, resistance heating method, and so on.

Figure 3A:
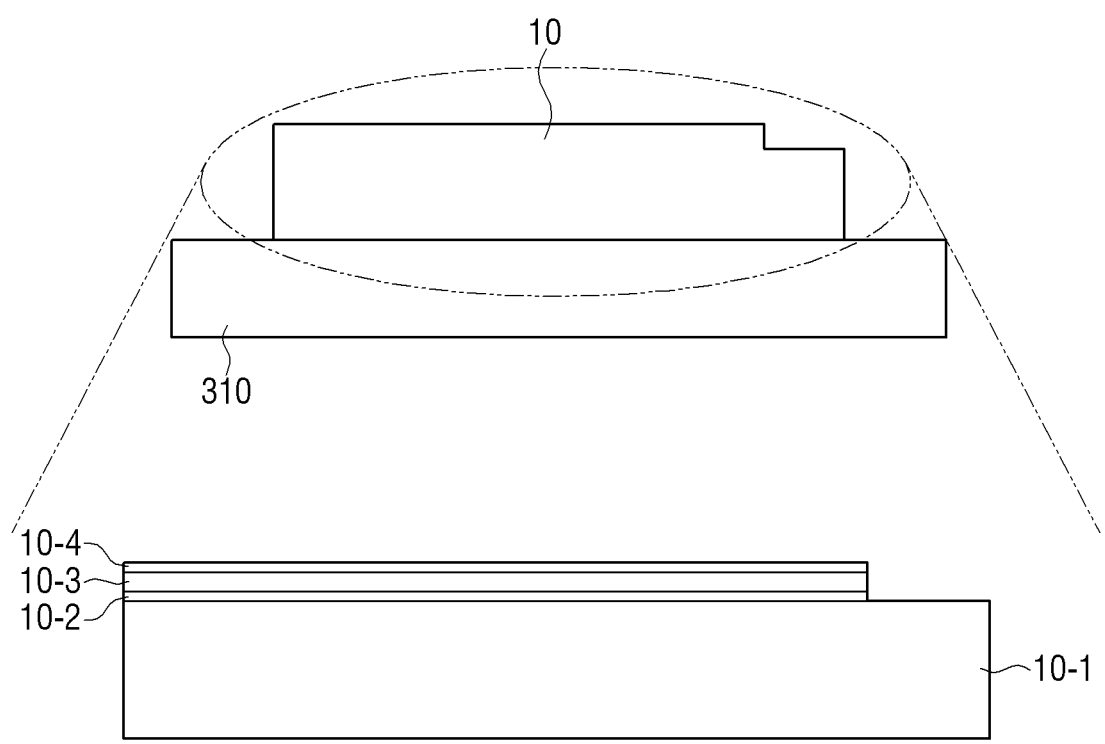
FIGS. 3A to 5C are views illustrating a method of manufacturing an LED apparatus according to an embodiment.

Referring to FIG. 3A, first, the light emitting diode 10 may be formed on a base substrate 310. Specifically, an n-type semiconductor layer 10-1 may be stacked on the base substrate 310, a quantum well layer 10-2 may be stacked on the n-type semiconductor layer 10-1, a p-type semiconductor layer 10-3 may be stacked on the quantum well layer 10-2 and an indium tin oxide (ITO) layer may be stacked on the p-type semiconductor layer 10-3. In an example, the base substrate 310 may be made of a material such as glass, Si, InP, GaAs, and so on.

In addition, the area of each of the n-type semiconductor layer 10-1, the quantum well layer 10-2, the p-type semiconductor layer 10-3, and the ITO 10-4 layer may be the same as the area of the base substrate 310.

Thereafter, as shown in FIG. 3A showing the light emitting diode 10, a certain region of the n-type semiconductor layer 10-1, the quantum well layer 10-2, the p-type semiconductor layer 10-3, and the ITO layer 10-4 may be etched. Since the etching method is well known technology, this will not be redundantly explained.

In an exemplary embodiment shown in FIG. 3A, the n-type semiconductor layer 10-1 is longer than the quantum well layer 10-2, the p-type semiconductor layer 10-3, and the ITO layer 10-4 so that the light emitting diode 10 has a concave edge. Further, in an exemplary embodiment, the substrate 310 may be longer than the light emitting diode 10 to accommodate for subsequent layers that may be added to the sides of the light emitting diode 10.

In an example, the n-type semiconductor layer 10-1 and the p-type semiconductor layer 10-3 may be stacked as GaN. The ITO layer 10-4 is a transparent conductive film having electrical conductivity, and it can reduce electrical resistance.

The light emitting diode 10 may be a material that emits blue light. However, exemplary embodiments are not limited thereto, and any light emitting diode 10 may be used as long as it can emit light.

Figure 3B:
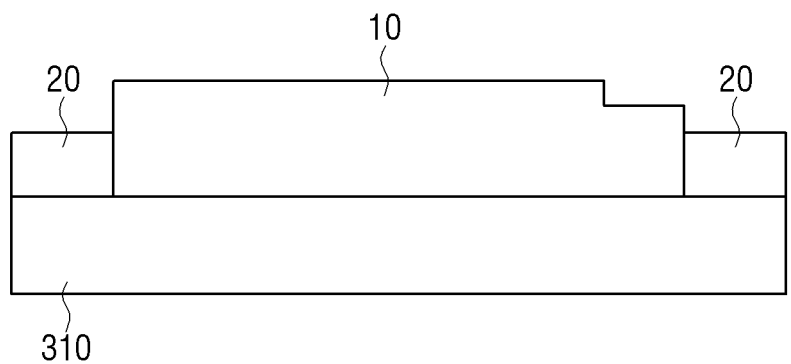

Then, as shown in FIG. 3B, the light leakage preventing layer 20 may be formed so as to surround the side surface of the light emitting diode 10. In an example, the light leakage preventing layer 20 may prevent light emitted from the light emitting diode 10 from being emitted through the side surface of the light emitting diode 10. Although in an exemplary embodiment of FIG. 3B, the light leakage preventing layer 20 is shown to surround only one side surface of the light emitting diode 10, the light leakage preventing layer may surround one or more of the side surfaces of the light emitting diode 10 and may surround these side surfaces in their entirety or with a portion of the side surface of the light emitting diode 10 not being covered such as layers 10-2 through 10-4 shown in FIG. 3A.

Figure 3C:
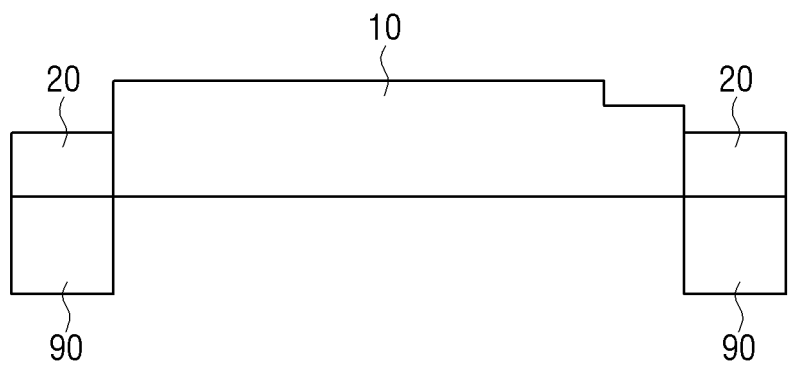

Then, as shown in FIG. 3C, the region in the base substrate 310 that corresponds to the light emitting diode 10 may be etched. By the 'region corresponding to the light emitting diode 10', it means the lower region of the light emitting diode 10 in the base substrate 310. Since the method of etching the base substrate 310 is already known technique, specific description thereof will be omitted.

When a certain region of the base substrate 310 is etched, the substrate 90 of FIG. 2 may be formed.

Meanwhile, in FIG. 3C, only the base substrate 310 is shown as being etched. However, exemplary embodiments are not limited thereto. For example, the region corresponding to the light emitting diode 10 in the base substrate 310 may be etched more deeply to further etch a certain region of the light emitting diode 10.

Thereafter, the wavelength converting material may be bonded to the exposed region of the light emitting diode 10 that is exposed as the base substrate 310 is etched. Meanwhile, the wavelength converting material is fabricated using a substrate other than the base substrate 310, as will be described in further detail below with reference to the drawings.

FIGS. 4A to 4E are views illustrating a method of forming a wavelength converting material on another substrate 410 ('second substrate'), in which the wavelength converting material may include a semiconductor layer including a quantum well layer, according to an exemplary embodiment.

Figure 4A:
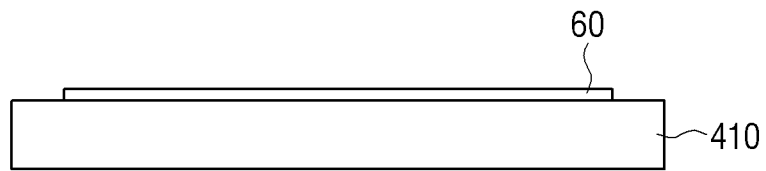

Referring to FIG. 4A, the upper DBR coating layer 60 may be formed on the second substrate 410 through CVD process. In an example, the second substrate 410 may be made of a material such as glass, Si, InP, GaAs, and so on.

Figure 4B:
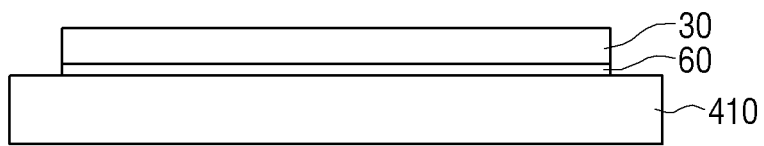

In addition, as shown in FIG. 4B, the wavelength conversion layer 30 may be formed on the upper DBR coating layer 60 through CVD process. In an example, the wavelength conversion layer 30 may be a semiconductor layer that includes a quantum well layer. Particularly, the wavelength conversion layer 30 is a II-VI group semiconductor material and may be one of a wavelength conversion layer corresponding to a red (R) color, a wavelength conversion layer corresponding to a green (G) color, a wavelength conversion layer corresponding to a blue (B) color, and a wavelength conversion layer corresponding to a white (W) color.

Figure 4C:
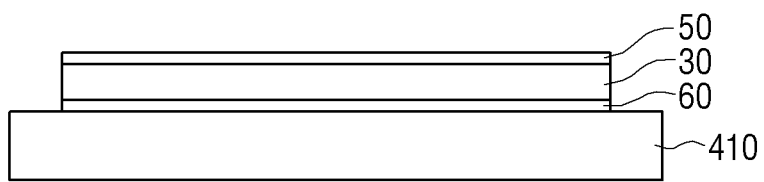

In addition, as shown in FIG. 4C, the lower DBR coating layer 50 may be formed on the wavelength conversion layer 30 through CVD process. In an example, the upper DBR coating layer 60, the wavelength conversion layer 30, and the lower DBR coating layer 50 may be formed to have a size corresponding to the area of the light emitting diode 10.

In an example, the wavelength conversion layer 30 may be sandwiched between the upper DBR coating layer 60 and the lower DBR coating layer 50 and may directly contact one or both of these coating layers.

Figure 4D:
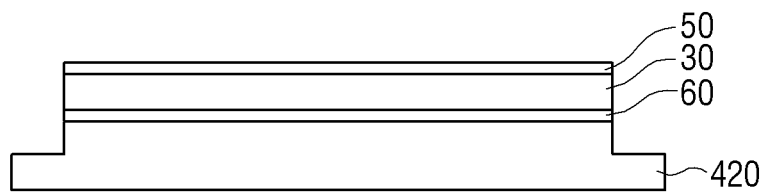

Then, as shown in FIG. 4D, the region other than the region corresponding to the light emitting diode 10 in the second substrate 410 may be etched. For example, the region other than the region corresponding to the light emitting diode 10 in the second substrate 410 may be removed with a photolithography process or a transfer process using a glass mold.

As described above, according to an exemplary embodiment, by forming the upper DBR coating layer 60, the wavelength conversion layer 30, and the lower DBR coating layer 50 in a size corresponding to the area of the light emitting diode 10, it is possible to etch only a certain region of the second substrate 410, thus forming the etched second substrate 420, as shown in FIG. 4D.

However, this is merely an example and the upper DBR coating layer 60, the wavelength conversion layer 30, and the lower DBR coating layer 50 may initially be formed to have a size corresponding to the area of the second substrate 410. In this case, when the region other than the region corresponding to the light emitting diode 10 is etched, a certain region of each of the upper DBR coating layer 60, the wavelength conversion layer 30, and the lower DBR coating layer 50 as well as a certain region of the second substrate 410 may also be etched.

Figure 4E:
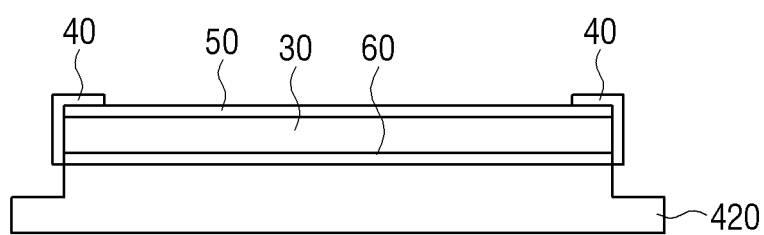

Then, as shown in FIG. 4E, a reflective layer 40 may be formed, surrounding the side surface of the wavelength converting material and extending by a predetermined length from the side surface of the wavelength converting material to a lower portion of the lower DBR coating layer. Specifically, the reflective layer 40 may be formed so as to surround the side surface of the wavelength conversion layer 30. According to an exemplary embodiment, the reflective layer 40 may cover the entire side surfaces of the wavelength conversion layer 30 and may additionally extend so as to cover a portion of the lower DBR coating layer 50, as shown in FIG. 4E.

In the above description of exemplary embodiments, the manufacturing process of FIG. 3 is described as being followed by the manufacturing process of FIG. 4. However, the manufacturing process of FIG. 3 and the manufacturing process of FIG. 4 are not limited to a certain sequence, and accordingly, any of them may be performed first. In addition, it is also possible to perform the manufacturing processes of FIGS. 3 and 4 at the same time or substantially same time.

Thereafter, the wavelength converting material of FIG. 4 may be bonded to the lower portion of the light emitting diode 10 of FIG. 3, which will be described in further detail below with reference to the drawings.

Figure 5A:
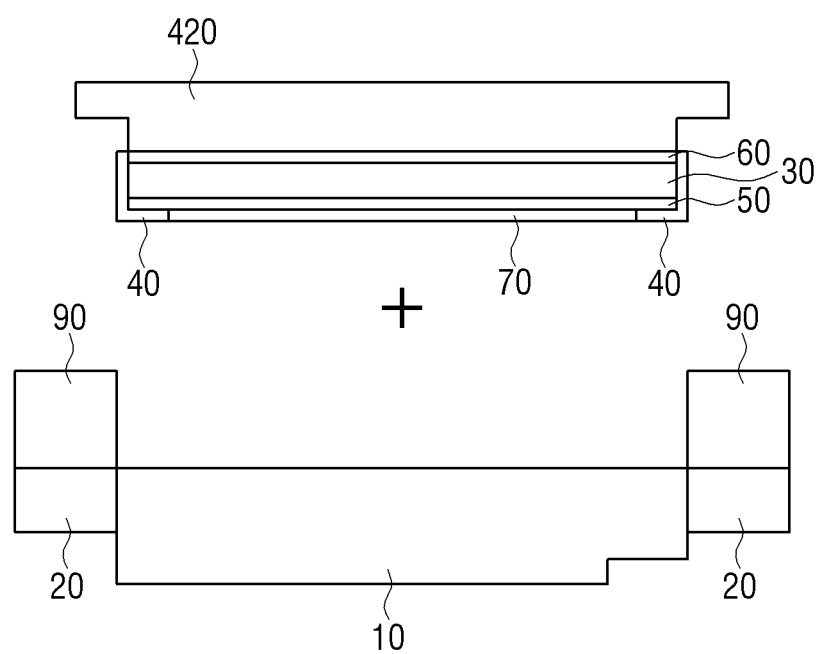

FIG. 5A is a view illustrating bonding of the light emitting diode such as the one described with reference to FIG. 3C with a wavelength converting material such as the one described with reference to FIG. 4E, according to an exemplary embodiment. In an exemplary embodiment, the wavelength converting material is inverted for bonding with the light emitting diode. Referring to FIG. 5A, the wavelength converting material may be bonded to the lower portion of the light emitting diode 10 such that the lower surface of the light emitting diode 10 is bonded to the lower DBR coating layer. In an example, the wavelength converting material may be in the state of being bonded to the etched second substrate 420. For the bonding, an optical adhesive layer 70 may be formed on the lower surface of the lower DBR coating layer 50 and bonded or directly bonded to the lower surface of the light emitting diode 10.

FIG. 5A is a view illustrating that the optical adhesive layer 70 is formed on the lower surface of the lower DBR coating layer 50. However, this is merely an example and it is also possible that the optical adhesive layer 70 is formed on one of the lower surface of the light emitting diode 10 and the lower surface of the lower DBR coating layer, to bond the wavelength converting material to the lower portion of the light emitting diode 10.

Further, in addition to the method that forms the optical adhesive layer 70, any method for bonding a wavelength converting material to the lower portion of the light emitting diode 10 may be used. For example, epoxy based on thermal deformation may be utilized. However, if a method involves forming a specific layer between the light emitting diode 10 and the wavelength converting material, then the specific layer formed has to be transparent.

Figure 5B:
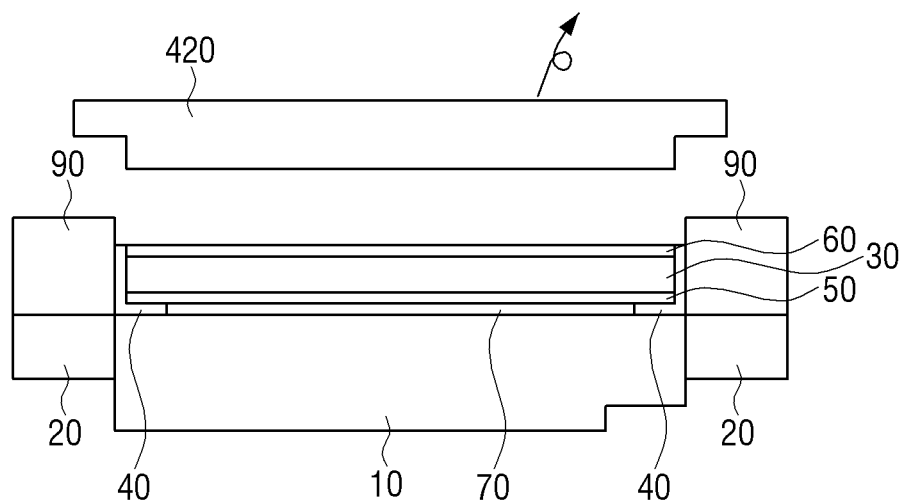

Next, as shown in FIG. 5B, after the wavelength converting material is bonded to the lower portion of the light emitting diode 10, the etched second substrate 420 included in the wavelength converting material may be removed. For example, in FIG. 4A, the adhesive layer may be formed before forming the upper DBR coating layer 60 on the second substrate 410. Then, after the wavelength converting material is bonded to the lower portion of the light emitting diode 10, a laser beam may be emitted to the adhesive layer formed between the etched second substrate 420 and the upper DBR coating layer 60, thus separating the etched second substrate 420 from the upper DBR coating layer 60. However, this is merely an example, and the etched second substrate 420 may be removed by any other method.

Figure 5C:
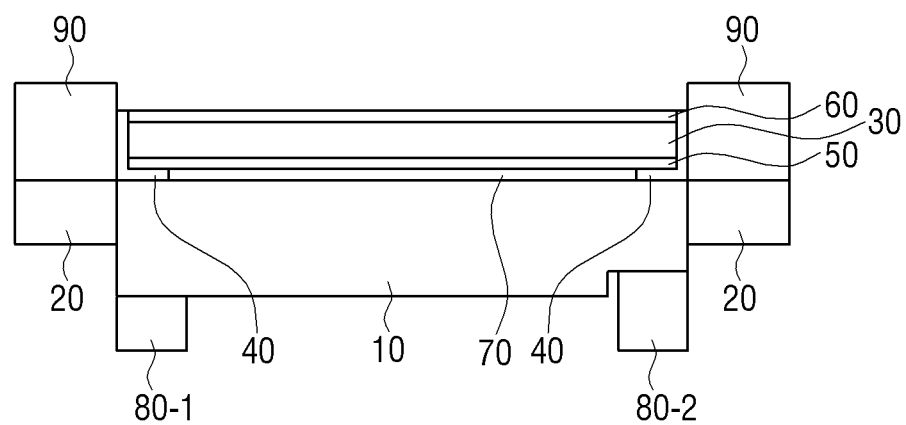

In addition, as shown in FIG. 5C, a plurality of pads 80-1, 80-2 may be formed under the light emitting diode 10 to receive external power. However, the time of forming the plurality of pads 80-1, 80-2 is not strictly limited. For example, the plurality of pads 80-1, 80-2 may have been formed in the light emitting diode 10 before the wavelength converting material is bonded to the lower portion of the light emitting diode 10.

Meanwhile, in FIGS. 4A to 5C, the lower DBR coating layer 50 and the upper DBR coating layer 60 are shown as being included, but this is only an example. For example, the wavelength converting material may include only the wavelength conversion layer 30 and the reflective layer 40 without including the lower DBR coating layer 50 and the upper DBR coating layer 60.

In the LED apparatus 1000 manufactured using the method described above, according to an exemplary embodiment, the wavelength conversion layer may convert a first wavelength of the light entering from the light emitting diode 10 into a predetermined second wavelength, and diffuse and emit the light of the second wavelength through the diffusion material, and the lower DBR coating layer 50 pass the light of the first wavelength emitted from the light emitting diode 10 and reflect the light of the second wavelength that is wavelength-converted by the wavelength conversion layer 30, and the upper DBR coating layer 60 pass the light of the second wavelength and reflect light of the wavelength other than the second wavelength, and the reflective layer 40 may reflect the wavelength-converted light emitted through the side surface and the lower portion of the wavelength converting material. Accordingly, it is possible to improve the quality of light emitted from the LED apparatus 1000. Specifically, since the wavelength conversion layer 30 may be formed with a uniform thickness as it is manufactured through a semiconductor process, the wavelength of the light emitted from the LED apparatus 1000 can be uniform.

Figure 6A:
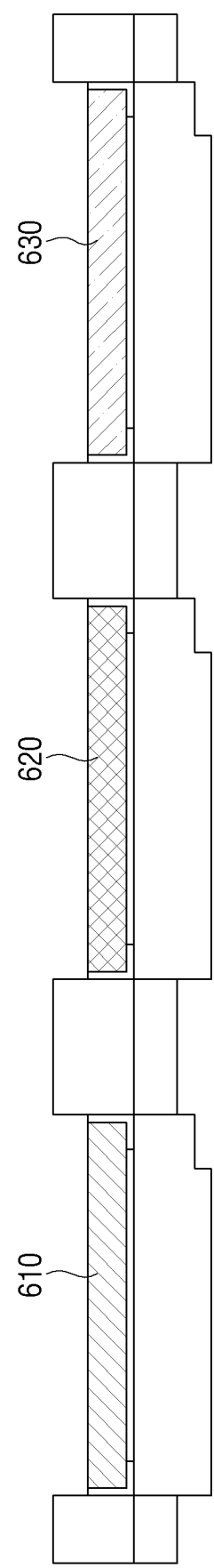
FIGS. 6A and 6B are views illustrating a plurality of packaged LED apparatuses according to an embodiment.
Figure 6B:
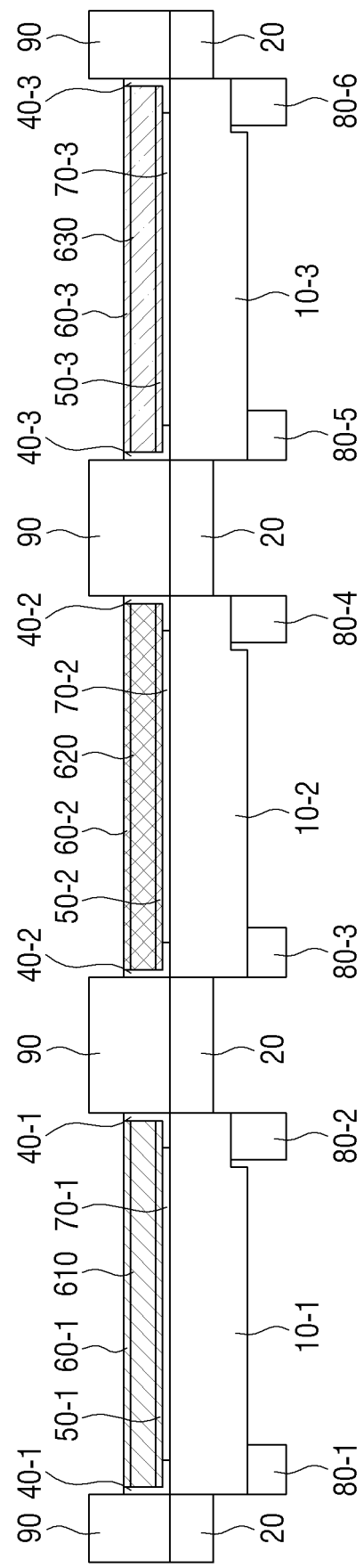

FIGS. 6A and 6B are views illustrating a plurality of packaged LED apparatuses 1000 according to an embodiment.

Exemplary embodiments have been described above with respect to a LED apparatus 1000 and manufacturing method thereof. However, a plurality of LED apparatuses 1000 may be used in a packaged state, as shown in FIG. 6A. For example, the first wavelength conversion layer 610 may be a wavelength conversion layer corresponding to a red (R) color, the second wavelength conversion layer 620 may be a wavelength conversion layer corresponding to a green (G) color, and the third wavelength conversion layer 630 may be a wavelength conversion layer corresponding to a blue (B) color. Such configuration may be used as one pixel, according to an exemplary embodiment.

In addition, the method of manufacturing the above-described configuration may also use the methods of FIGS. 3A to 5C. For example, the method of FIGS. 3A to 3C may be modified such that a plurality of light emitting diodes may be formed on a one substrate. According, to an exemplary embodiment, a single substrate may be used to manufacture a plurality of light emitting diodes such as the three light emitting diodes of different colors described above. In addition, the method of FIGS. 4A to 4E may also be modified such that a plurality of wavelength converting materials may be formed on one other substrate. That is, according to an exemplary embodiment, a single substrate may be used to manufacture a plurality of wavelength converting materials respectively corresponding to the light emitting diodes such that one wavelength converting material corresponds to one respective light emitting diode. However, the plurality of wavelength converting materials may have different materials in order to emit different color lights. Then, as shown in FIGS. 5A to 5C, a plurality of packaged LED apparatuses 1000 as shown in FIG. 6A may be manufactured by bonding the one substrate to a second substrate and then removing the second substrate.

In addition, it is also possible to repeatedly arrange the structure such as the one described above to form a display. In this case, the entire plurality of LED apparatuses 1000 being packaged as shown in FIG. 6A may form one pixel, and each of the LED apparatuses of the plurality of LED apparatuses 1000 in package may operate as a subpixel.

In addition, in order to actually mass-produce the LED apparatuses 1000, a plurality of wavelength converting materials of the same material may be formed using the method described above, and then diced into a plurality of LED apparatuses 1000.

Alternatively, the first wavelength conversion layer 610, the second wavelength conversion layer 620, and the third wavelength conversion layer 630 may all be formed of the same material to manufacture a package of a plurality of LED apparatuses 1000 that emits a monochromatic color light.

Meanwhile, in order to explain the utilization of the packaged LED apparatus more clearly, by way of an example, FIG. 6A shows the LED apparatus 1000 only, while omitting illustration of some other configurations and most of the reference drawings.

However, as shown in FIG. 6B, it is to be noted that a plurality of packaged LED apparatuses 1000 may include all configurations described above. That is, the plurality of packaged LED apparatus 1000 may include light emitting diodes 10-1, 10-2, 10-3, a light leakage preventing layer 20, wavelength conversion layers 610, 620, 630, reflective layers 40-1, 40-2, 40-3, lower DBR coating layers 50-1, 50-2, 50-3, upper DBR coating layers 60-1, 60-2, 60-3, optical adhesive layers 70-1, 70-2, 70-3, a plurality of pads 80-1, 80-2, 80-3, 80-4, 80-5, 80-6, and a substrate 90.

However, according to the purpose of manufacture or manufacturing design, the type of the wavelength conversion layers 610, 620, 630, the lower DBR coating layers 50-1, 50-2, 50-3, and the upper DBR coating layers 60-1, 60-2, 60-3 may vary. For example, in order to form one pixel, each of the wavelength conversion layers 610, 620, 630 may be a wavelength conversion layer corresponding to a red (R) color, a wavelength conversion layer corresponding to a green (G) color, and a wavelength conversion layer corresponding to a blue (B) color, and the lower DBR coating layers 50-1, 50-2, 50-3 and the upper DBR coating layers 60-1, 60-2, 60-3 may be formed to correspond to the adjacent wavelength conversion layers. Specifically, referring only to an example of the LED element 1000 located at the leftmost side, the lower DBR coating layer 50-1 may pass the light of a first wavelength emitted from the light emitting diode 10-1, and reflect the second wavelength (i.e., wavelength corresponding to the R color) that is wavelength-converted by the wavelength conversion layer 610. The upper DBR coating layer 60-1 may pass the light of the second wavelength (wavelength corresponding to the R color) that is wavelength-converted by the wavelength conversion layer 610 and reflect the light of wavelengths other than the second wavelength (i.e., wavelength corresponding to the R color).

Since the rest configurations are the same as those described above, the redundant description will be omitted.

Figure 7:
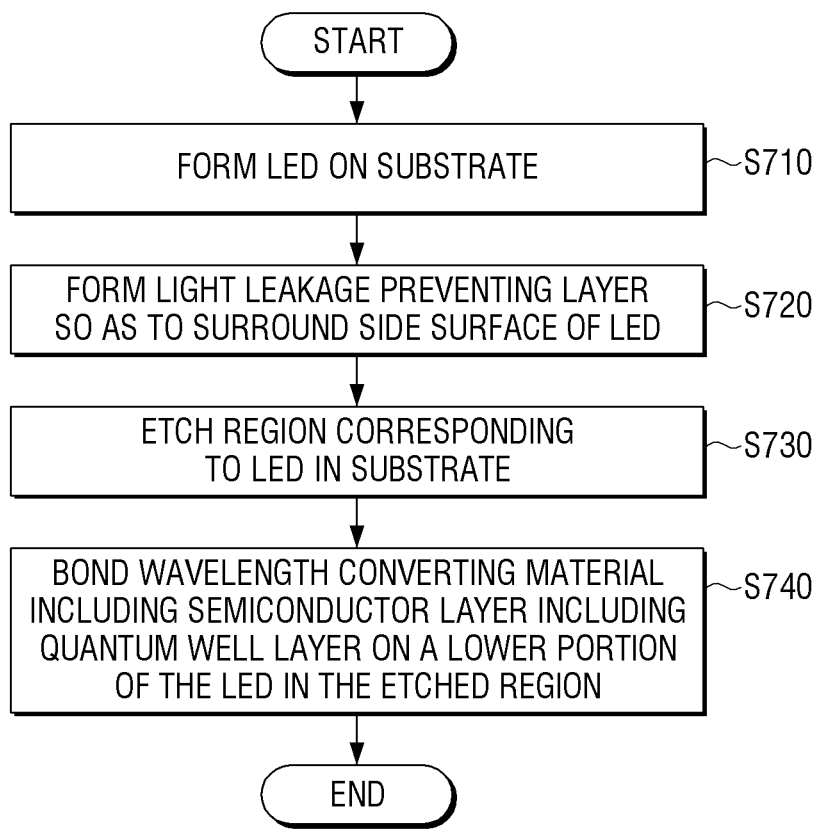
FIG. 7 is a flowchart illustrating a method of manufacturing an LED apparatus according to an embodiment.

FIG. 7 is a flowchart illustrating a method of manufacturing an LED apparatus according to an exemplary embodiment.

First, a light emitting diode is formed on the substrate, in operation S710. Then, the light leakage preventing layer is formed so as to surround the side surface of the light emitting diode, in operation S720. Then, the region corresponding to the light emitting diode in the substrate is etched, in operation S730. Then, a wavelength converting material including a semiconductor layer including a quantum well layer is bonded to the lower portion of the light emitting diode in the etched region, in operation S740. In this example, the semiconductor layer including a quantum well layer may be an inorganic semiconductor layer.

In addition, the method may additionally include generating a wavelength converting material, which may include: forming an upper distributed Bragg reflector (DBR) coating layer on another substrate ('second substrate') through deposition process; forming a wavelength conversion layer on the upper DBR coating layer through CVD process; forming a lower DBR coating layer on the wavelength conversion layer through the CVD process; and etching the region of the second substrate other than the region corresponding to the light emitting diode, and bonding in operation 5740 may include bonding the wavelength converting material to a lower portion of the light emitting diode so that the lower DBR coating layer is bonded to the lower surface of the light emitting diode. In an example, instead of the CVD process, one of the MOCVD and MBE may be used to form a DBR coating layer. In addition, instead of the CVD process, one of the MOCVD and MBE may be used to form the wavelength conversion layer.

In an example, the upper DBR coating layer, the wavelength conversion layer, and the lower DBR coating layer may be formed to have a size corresponding to the area of the light emitting diode.

In addition, after bonding the wavelength converting material to a lower portion of the light emitting diode, the method may additionally include removing the second substrate included in the wavelength converting material.

Meanwhile, forming the wavelength converting material may additionally include forming a reflective layer, which surrounds the side surface of the wavelength converting material and is extended by a predetermined length from the side surface of the wavelength converting material to a lower portion of the lower DBR coating layer.

In an example, the light leakage preventing layer may prevent light emitted from the light emitting diode from being emitted through the side surface of the light emitting diode, the wavelength conversion layer may convert a first wavelength of light entering from the light emitting diode to a predetermined second wavelength and diffuse and emit the light of the second wavelength to the outside through a diffusion material, the lower DBR coating layer may pass the light of the first wavelength emitted from the light emitting diode and reflect the light of the second wavelength that is wavelength-converted by the wavelength conversion layer, the upper DBR coating layer may pass the light of the second wavelength and reflect the light of a wavelength other than the second wavelength, and the reflective layer may reflect the wavelength-converted light emitted through the side surface and the lower portion of the wavelength converting material.

Meanwhile, the bonding in operation S740 may include forming an optical adhesive layer on one of the lower surface of the light emitting diode and the lower surface of the lower DBR coating layer to bond the wavelength converting material to a lower portion of the light emitting diode.

In addition, the wavelength conversion layer may be one of a wavelength conversion layer corresponding to red (R) color, a wavelength conversion layer corresponding to green (G) color, a wavelength conversion layer corresponding to blue (B) color, and a wavelength conversion layer corresponding to white (W) color.

Meanwhile, the method may further include forming a plurality of pads under the light emitting diode to receive external power.

In addition, the wavelength conversion layer may be a II-VI group semiconductor material.

According to various exemplary embodiments described above, a semiconductor manufacturing process may be used so that the size of the LED apparatus can be further reduced (e.g., to 10 µm or below), while uniform optical performance is ensured.

In addition, since the thin film type wavelength conversion layer is used, the transmittance, color gamut and color purity can be improved as compared with the related examples using materials such as phosphors or quantum dots.

In addition, according to the manufacturing process described above, unlike related technologies, it is not necessary to perform a separate process to apply phosphors or quantum dots, and it is possible to reduce manufacture cost because the light leakage preventing layer serves as the partitioning walls, thus saving additional process to form partitioning walls in the semiconductor process.

Meanwhile, although the layer is described as being formed through the CVD process, exemplary embodiments are not limited thereto. For example, the layer may be formed through a growing process.

The present disclosure has been described in detail. However, it should be understood that the detailed description and specific examples, while indicating exemplary embodiments of the disclosure, are given by way of illustration only, since various changes and modifications within the scope of the disclosure will become apparent to those skilled in the art from this detailed description. Therefore, the scope of the present disclosure is defined not by the detailed description of exemplary embodiments but by the appended claims and their equivalents, and all differences within the scope will be construed as being included in the present disclosure.

What is claimed is:

1. A manufacturing method of manufacturing a light emitting diode (LED) apparatus, the manufacturing method comprising:
   forming a LED on a substrate;
   forming a light leakage preventing layer that surrounds at least one side surface of the LED;
   etching a region corresponding to the LED in the substrate;
   forming a wavelength converting material on an other substrate through a chemical vapor deposition (CVD) process;
   etching a region of the other substrate, which is outside of a location of the LED; and
   bonding the wavelength converting material to a lower portion of the LED in the etched region of the substrate,
   wherein the wavelength converting material comprises a semiconductor layer that includes a quantum well layer, and
   wherein the forming the wavelength converting material comprises:
      forming an upper distributed Bragg reflector (DBR) coating layer on the other substrate through the CVD process;
      forming a wavelength conversion layer on the upper DBR coating layer through the CVD process; and
      forming a lower DBR coating layer on the wavelength conversion layer through the CVD process.

2. The manufacturing method of claim 1, wherein the upper DBR coating layer, the wavelength conversion layer, and the lower DBR coating layer are formed to have a size which corresponds to a size of the LED.

3. The manufacturing method of claim 1, further comprising, after the bonding the wavelength converting material to the lower portion of the LED, removing the other substrate.

4. The manufacturing method of claim 1, wherein the forming the wavelength converting material further comprises forming a reflective layer that surrounds at least one side surface of the wavelength converting material and that extends by a predetermined length from the at least one side surface of the wavelength converting material to a lower portion of the lower DBR coating layer.

5. The manufacturing method of claim 4, wherein:
   the light leakage preventing layer prevents light emitted from the LED from being scattered through the at least one side surface of the LED,
   the wavelength conversion layer converts a first wavelength of the light from the LED into a second wavelength, and diffuses and emits the light of the second wavelength to outside through a diffusion material,
   the lower DBR coating layer passes the light of the first wavelength emitted from the LED and reflects the light of the second wavelength, the upper DBR coating layer passes the light of the second wavelength and reflects the light of a wavelength other than the second wavelength, and the reflective layer reflects the light emitted through the at least one side surface and a lower surface of the wavelength converting material.

6. The manufacturing method of claim 1, wherein the bonding comprises forming an optical adhesive layer on at least one of a lower surface of the LED and a lower surface of the lower DBR coating layer, which bonds the wavelength converting material to the lower portion of the LED.

7. The manufacturing method of claim 1, wherein the wavelength converting material is one of: a first wavelength conversion layer corresponding to a red (R) color; a second wavelength conversion layer corresponding to a green (G) color; a third wavelength conversion layer corresponding to a blue (B) color; and a fourth wavelength conversion layer corresponding to a white (W) color.

8. The manufacturing method of claim 1, further comprising forming a plurality of pads under the LED, which receive power from an external source.

9. The manufacturing method of claim 1, wherein the wavelength converting material is a II-VI group semiconductor material.

10. The manufacturing method of claim 1, wherein the upper DBR coating layer, the wavelength conversion layer, the lower DBR coating layer, and the LED are stacked on one another and have substantially a same size.

\* \* \* \* \*